(12) United States Patent
Luo et al.

(10) Patent No.: US 8,807,948 B2
(45) Date of Patent: Aug. 19, 2014

(54) SYSTEM AND METHOD FOR AUTOMATED REAL-TIME DESIGN CHECKING

(75) Inventors: Wilbur Luo, San Jose, CA (US); Olivier Pribetich, Vallauris (FR); Olivier Omedes, Roquefort les Pins (FR); Roland Ruehl, San Carlos, CA (US); Ya-Chieh Lai, Mountain View, CA (US); Frank E. Gennari, San Jose, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 0 days.

(21) Appl. No.: 13/248,914

(22) Filed: Sep. 29, 2011

(65) Prior Publication Data

US 2013/0086541 A1    Apr. 4, 2013

(51) Int. Cl.
*B63H 1/06* (2006.01)
(52) U.S. Cl.
USPC .......................................... 416/136
(58) Field of Classification Search
USPC .......................................... 716/136
See application file for complete search history.

(56) References Cited

U.S. PATENT DOCUMENTS

| | | | | |
|---|---|---|---|---|
| 7,219,317 | B2* | 5/2007 | Lakshmanan et al. | 716/112 |
| 2004/0078724 | A1* | 4/2004 | Keller et al. | 714/48 |
| 2005/0235234 | A1* | 10/2005 | Lakshmanan et al. | 716/4 |
| 2006/0242615 | A1* | 10/2006 | Mimura et al. | 716/15 |
| 2013/0086541 | A1* | 4/2013 | Luo et al. | 716/112 |

* cited by examiner

*Primary Examiner* — Vuthe Siek
*Assistant Examiner* — Mohammed Alam
(74) *Attorney, Agent, or Firm* — Kenyon & Kenyon LLP (57) ABSTRACT

Systems and methods for real-time design checking of an integrated circuit design, include the operations of receiving at a design tool, design elements of an integrated circuit design entered by an integrated circuit designer; the design tool performing real-time design checks on the design elements as they are entered by the integrated circuit designer to determine whether a design element violates a design rule; when the design tool detects a violation of a design rule based on the design checks alerting the integrated circuit designer; and the design tool presenting a correction to correct the violation of the design rule. The real-time design checks can include, comparing each design element to one or more known non-compliant design elements stored in a database to determine whether a non-compliant design element was entered or is being entered by the integrated circuit designer.

39 Claims, 7 Drawing Sheets

SYSTEM AND METHOD FOR AUTOMATED REAL-TIME DESIGN CHECKING

TECHNICAL FIELD

The presently disclosed systems and methods relate generally to semiconductor design, and more particularly, some embodiments relate to systems, methods and technologies for real-time automated design checking for semiconductor integrated circuit design.

DESCRIPTION OF THE RELATED ART

Integrated circuits, or ICs, are generally created by patterning a plurality of devices and their interconnects onto a substrate such as a semiconductor wafer. This process generally starts with a design for the circuit or circuits that will make up the IC. A top-down design methodology is commonly employed using hardware description languages (HDLs), such as Verilog®, RTM® or VHSIC hardware description language (VHDL), for example. Through the use of HDLs, the designer creates an integrated circuit by hierarchically defining functional components of the circuit.

From the HDL or other high-level description, the actual logic cell implementation may be determined by logic synthesis, which converts the functional description of the circuit into a specific circuit implementation. The logic cells are then assigned physical locations in the device layout and their interconnections are defined. This is sometimes referred to as layout and routing. The placement and routing tools used by designers generally accept as their input a flattened netlist that has been generated by the logic synthesis process. This flattened netlist identifies the specific logic cell instances from a target standard cell library, and describes the specific cell-to-cell connectivity. By application of a physical design process, the logic cells of the netlist file are placed and routed, resulting in a layout file. This layout, then, can be transferred or applied to the semiconductor substrate in a series of layers that collectively will form the devices that make up the components of the integrated circuit.

A process by which these layers are patterned on the substrate is known as photolithography. During photolithography, a series of photomasks created from the layout file are used to transfer the layout onto the substrate layer by layer. There are different types of photomasks including binary, chrome-on-glass, attenuated phase-shifting masks (attPSM) and alternating phase-shifting masks (altPSM). A photomask, or more simply a mask, provides an image of the physical geometries of its associated integrated circuit layer or parts of a layer. Passing light through transparent sections defined by the mask elements transfers the layout pattern for the associated layer onto the wafer. The light pattern is passed through an imaging lens system and focused at the desired size on the wafer surface. A typical photolithography system uses UV light energy to project the mask pattern onto the wafer surface. The projected light pattern interacts with a photosensitive coating on the wafer and, depending on the coating used; it can be cured or rendered susceptible to removal as a result of the exposure. Accordingly, the projection of the mask pattern onto the coating can be used to transfer the pattern to the wafer.

With a continuing desire to provide greater functionality in smaller packages and the evolution of more complex system-on-chip and mixed-signal designs, IC feature geometries are being driven to smaller and smaller dimensions. Also, the shrinking of feature dimensions can lead to an increase in the number of chips that can be obtained from a given wafer. However, the ability to project an accurate image of increasingly smaller features onto the wafer is limited by the wavelength of the light used, and the ability of the lens system to capture enough diffraction orders from the illuminated mask. Accordingly, the resolution limit of conventional optical lithography technology is increasingly being challenged by the sub wavelength, or low-k1, dimensions of the critical IC feature geometries.

Extreme precision is required for sub wavelength, or low-k1, applications due to highly non-linear imaging behaviors, which often magnify mask errors by large factors and in non-intuitive manners. The impact of even small errors in the design (such as those errors on the order of nanometers) of a single mask can lead to complete failure of an entire design. It has therefore become important that the design of individual masks be optimized against such errors even before fabrication of the semiconductor begins. To avoid or reduce the occurrence of such costly errors, design rules have been developed and implemented to verify the designs before the wafer is fabricated.

BRIEF SUMMARY

According to various embodiments of the disclosed systems and methods, a design tool can be configured to perform design checking of an integrated circuit design, include the operations of receiving at a design tool, design elements of an integrated circuit design entered by an integrated circuit designer; the design tool performing real-time design checks on the design elements as they are entered by the integrated circuit designer to determine whether a design element violates a design rule; when the design tool detects a violation of a design rule based on the design checks alerting the integrated circuit designer; and the design tool presenting a correction to correct the violation of the design rule. The real-time design checks can include, comparing each design element to one or more known non-compliant design elements stored in a database to determine whether a non-compliant design element was entered or is being entered by the integrated circuit designer.

In some embodiments, the operation of presenting a correction to correct the violation of the design rule comprises the design tool automatically substituting a corrected design element for a non-compliant design element that resulted in the violation of the design rule or the design tool can be configured to present a valid design element to the integrated circuit designer and provide the integrated circuit designer with an option to substitute the valid design element in place of a non-compliant design element that resulted in the violation of the design rule. In some embodiments, the systems and methods can further include the design tool receiving a user selection regarding substituting the valid design element in place of a non-compliant design element and, if instructed by the user make the substitution, replacing the non-compliant design element with the valid design element in the circuit.

In various applications, the design elements comprise patterns on one or more layers of the integrated circuit and the real-time design checks comprise comparing the patterns with known patterns in a database using image based pattern recognition as the design elements are entered into the integrated circuit design. Additionally, the design elements can comprise wire interconnects between integrated circuit components, and a real-time design check for a given wire comprises a checking circuit parameter associated with the wire against one or more defined circuit parameters in a database to determine whether the wire as drawn, or as it is being drawn, constitutes a design violation. The circuit parameter can include, for example, wire length, driver specification, wire RC characteristics, load amount, and parasitic effects. Further, the correction can include at least one of respecifying a driver driving the given wire, add shielding along a portion or along the length of the wire, rerouting the wire along a shorter route, altering the layout of the design to relocate the integrated circuit components being connected by the wire.

In still further embodiments, the a real-time design check for a first design element comprises performing DFM analysis on the first design element, and wherein the correction comprises at least one of wire spreading, using double cut vias, using contact of via bars, substituting higher yield cells where permitted by timing, power, and routability, changing the spacing and width of interconnect wires, and adding dummy patterns.

Various embodiments can be implemented such that the design tool receiving input from the integrated circuit designer identifying a design element as a critical feature, and wherein the design tool selects the correction based on whether or not the design element is a critical feature.

Alerting the integrated circuit designer to an error can include highlighting a design element that is identified as violating a design rule or providing a message to the designer that the design element violates a design rule. The system can further be implemented such that presenting a correction to correct the violation of the design rule comprises displaying a known valid design element to the integrated circuit designer that can be used in place of or in addition to the design element that is identified as violating a design rule. In some embodiments, the correction is implemented automatically by the design tool, or the correction is presented to the integrated circuit designer and the design tool accepts input from the integrated circuit designer instructing the design tool whether or not to implement all or part of the correction.

Other features and aspects of the disclosed systems and methods will become apparent from the following detailed description, taken in conjunction with the accompanying drawings, which illustrate, by way of example, the features in accordance with embodiments of the disclosed systems and methods. The summary is not intended to limit the scope of the claimed invention, which is defined solely by the claims attached hereto.

BRIEF DESCRIPTION OF THE DRAWINGS

The disclosed systems and methods, in accordance with one or more various embodiments, is described in detail with reference to the following Figures. The drawings are provided for purposes of illustration only and merely depict either typical embodiments or examples of particular embodiments. These drawings are provided to facilitate the reader's understanding of the disclosed systems and methods and shall not be considered limiting of the breadth, scope, or applicability of the claimed invention. It should be noted that for clarity and ease of illustration these drawings are not necessarily made to scale.

The Figures are not intended to be exhaustive or to limit the claimed invention to the precise form disclosed. It should be understood that the disclosed systems and methods can be practiced with modification and alteration, and that the claimed invention should be limited only by the claims and the equivalents thereof.

DETAILED DESCRIPTION

According to various embodiments of the disclosed systems and methods, real-time design checking of an integrated circuit design is provided. The real-time design checking may include, in various embodiments, the operations of receiving at a design tool, design elements of an integrated circuit design entered by an integrated circuit designer; the design tool performing real-time design checks on the design elements as they are entered by the integrated circuit designer to determine whether a design element violates a design rule; when the design tool detects a violation of a design rule based on the design checks alerting the integrated circuit designer; and the design tool presenting a correction to correct the violation of the design rule. The real-time design checks can include, comparing each design element to one or more known non-compliant design elements stored in a database to determine whether a non-compliant design element was entered or is being entered by the integrated circuit designer.

Figure 1:
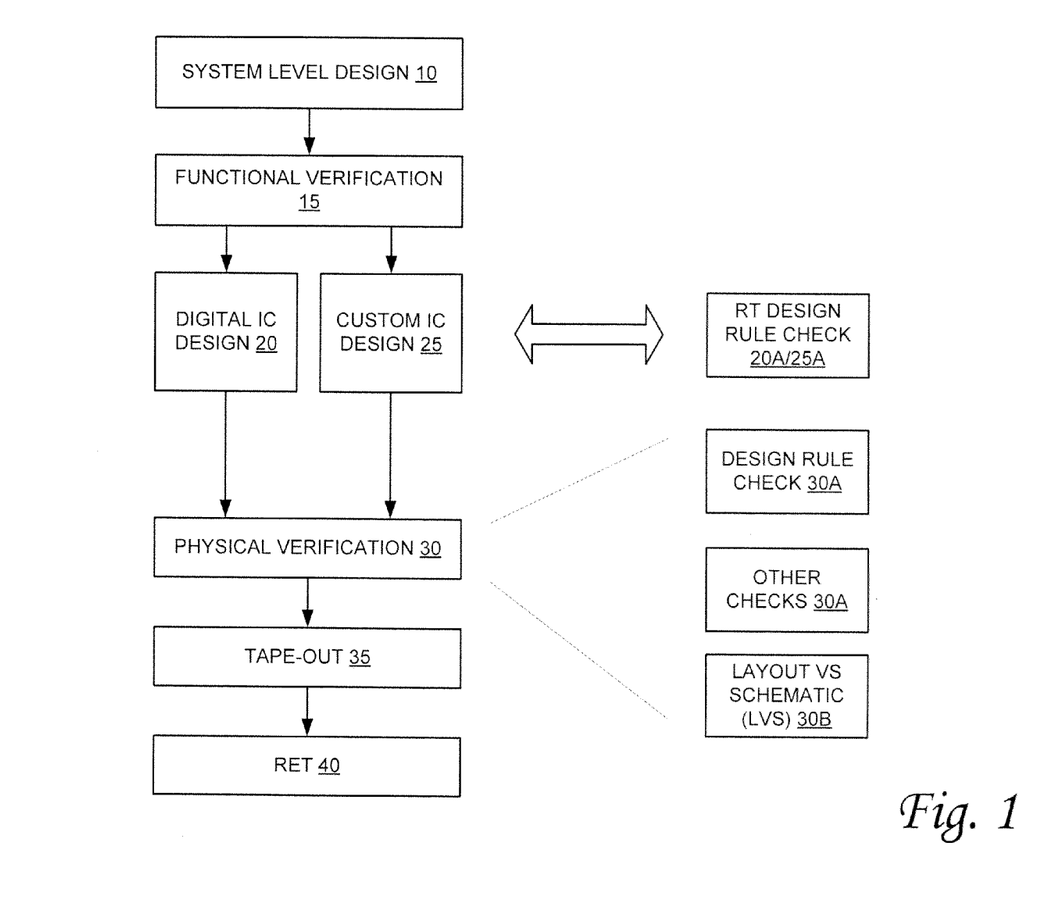
FIG. 1 is a diagram illustrating a generalized view of an exemplary process flow for the design of a semiconductor in accordance with the systems and methods described herein.

FIG. 1 is a diagram illustrating a generalized view of an exemplary process flow for the design of a semiconductor in accordance with the systems and methods described herein. Referring now to FIG. 1, in this example, at an initial step 10, system level design occurs, after which a functional verification 15 may be performed. Digital integrated circuit (IC) design 20 and/or custom IC design 25 can then implemented as required. The present invention can be implemented, in some embodiments as part of IC design 20, 25. As illustrated, during IC design 20, 25, design rule checks 20A, 25A can be performed by the design tool to verify the current design and to flag any design violations against the rules. Preferably, the design rule checks are performed in real time as the designer is building the design. Although not illustrated in FIG. 1, real-time design rule checks can also be performed during layout and routing, as described below with reference to FIG. 3.

In some embodiments, the real time design rule checks 20A, 25A, 250A (FIG. 3) can be implemented as image or pattern-based design rules, or as Boolean and other rules to check elements of the design as it is being made to verify that the structure meets the established constraints for a given process technology and design class. Elements that can be checked can include, for example, active to active spacing, well-to-well spacing, minimum channel length of the transistor, minimum metal width, metal-to-metal spacing, metal fill density, and the like. Checks of these geometric and connectivity parameters can be made to ensure design margins are sufficient to account for variability in the manufacturing processes for the given geometry and process technology.

Following the IC design steps, a physical verification 30 can be performed. The physical verification step may comprise multiple forms of validations, verifications and other checks, including, for example, design rule checks 30A, layout versus schematic (LVS) verification 30B, and others (e.g., Parasitic Extraction) 30C. Design rule checks 30A in this instance are not real time, but are done after the design is completed. Such post-design checks 30A do not allow real-time intervention and correction as do real-time design rule checks 20A and 30A.

Once the physical verification is performed and the design is considered to meet the required design standards, tape-out 35 can occur. Following tape-out 35, resolution enhancement techniques (RET) 40 can be performed. RET is the general name for a number of pre-compensation steps that can significantly improve the image contrast and pattern fidelity on the reticle. The two main RET approaches are optical proximity correction (OPC) and phase-shift masks (PSM). With OPC, the layout can be adjusted to add or subtract the necessary light to increase pattern fidelity. With PSM, topographic structures might be added to the layout to introduce contrast-enhancing fringes on the image. Following RET 40, the mask set for the IC can be generated.

There are two major styles of semiconductor design: fully custom design and semi-custom design. By giving the designer complete control over the size and placement of transistors and conductors, the fully custom design generally requires a higher level of effort, but tends to result in the higher performance designs. In contrast, semi-custom design is often at a logic or gate level and is more time-efficient and economical for low-volume designs. In various embodiments, the present invention can be implemented within both the fully custom and semi-custom design flows. Modern designers can choose one, the other, or some combination of custom and semi-custom design based on the requirements of their product.

Figure 2:
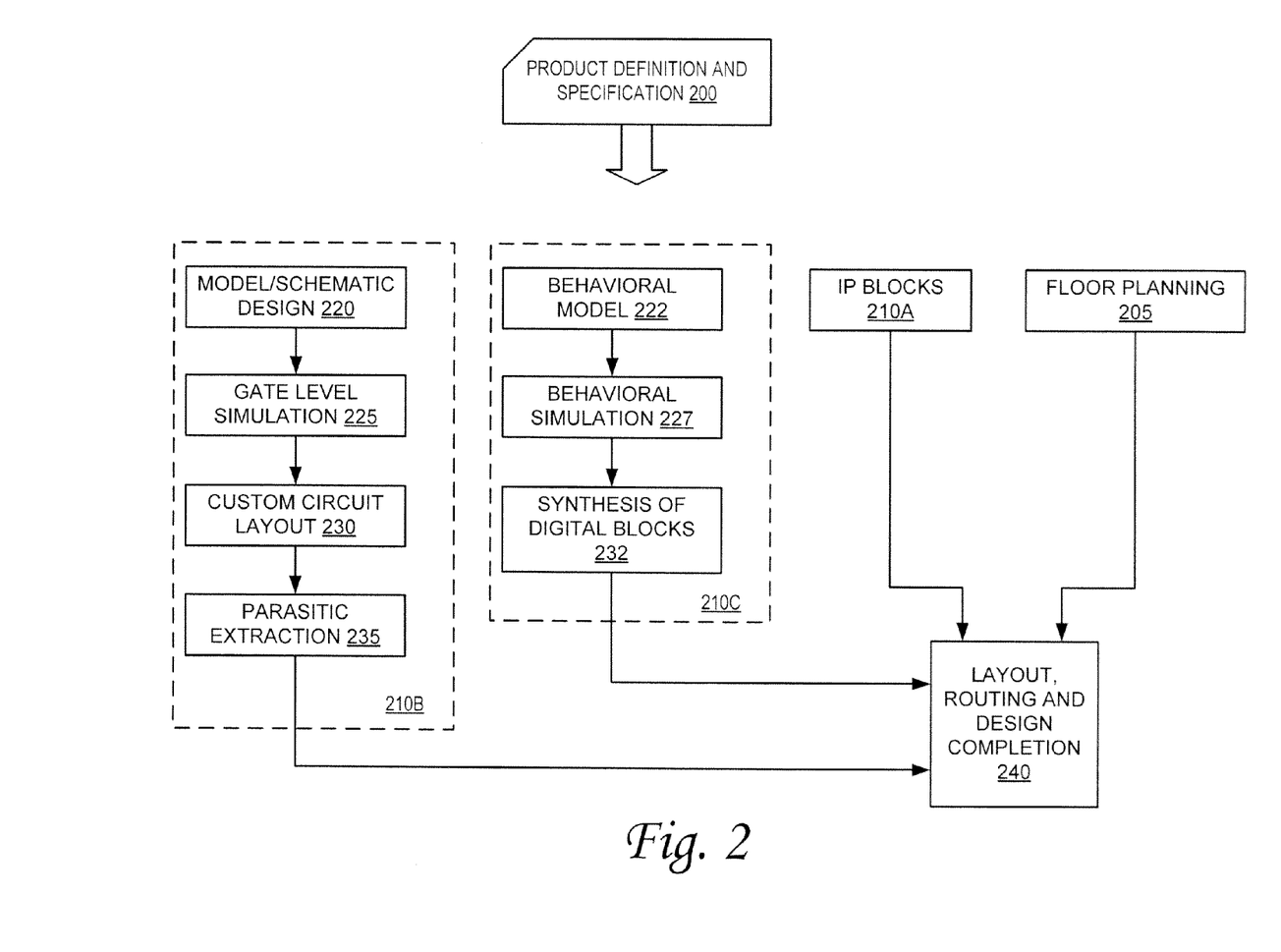
FIG. 2 is a diagram illustrating a more detailed view of the design process with which embodiments of the invention can be implemented.
Figure 3:
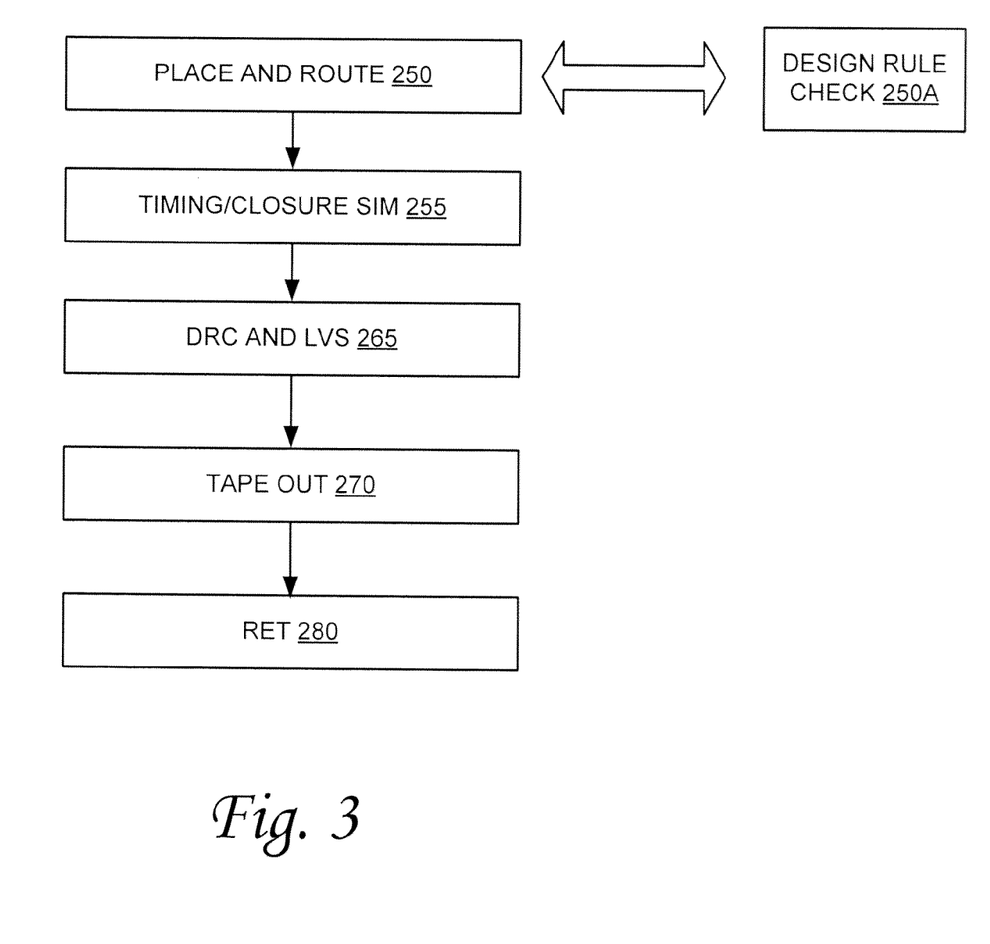
FIG. 3 is a diagram illustrating an example process for layout, routing and completion of the integrated circuit design with which embodiments of the invention can be implemented.

FIG. 2 is a diagram illustrating a more detailed view of the design process with which embodiments of the invention can be implemented. FIG. 3 is a diagram illustrating an example process for layout, routing and completion of the integrated circuit design with which embodiments of the invention can be implemented. As shown in FIG. 2, the starting point for a designer is to define a product and product specifications 200. A system level simulation, for example, one based on the C language such as SystemC, may be optionally performed at this stage in the design.

As this example illustrates, there are several options for creating the design blocks for the integrated circuit. These options include using third party intellectual property 210A, using a "register transfer level" (RTL) design (also called a "register transfer logic" design) 210C or performing a fully custom integrated circuit design 210B.

As also illustrated in this example, the arrangement of the design blocks (e.g., blocks created using 3$^{rd}$ Party IP, RTL and/or custom design) for the integrated circuit is performed by chip floor planning 205. Floor planning 205 divides the overall integrated circuit layout area into different sections, typically devoted to different purposes (such as ALU, memory, decoding, etc.). As a part of the floor planning operation, layout designers determine approximate placement of large circuit blocks on the integrated circuit. Generally, a floor planning application may be used by the designer to aid in determination of an optimized floor plan for the integrated circuit. The floor planning operation can be implemented so as to examine factors such as interconnect wire density, wire lengths and the like. Circuit placement (not illustrated as a separate step) can be used to define the alignment and orientation of the design blocks. The process continues at step 240, in which layout, routing and completion of the IC design are performed. An example of this process is illustrated in FIG. 3.

With continued reference to FIG. 2, the custom circuit design flow 210B is now described in more detail. Based on the requirements of the custom block, a gate level model of the design may be developed 220. The gate level model 220 might involve generation of schematics, followed by a gate level simulation 225. It will be understood by those skilled in the art that numerous tools are available to the modem chip designer to assist in the development of the gate level model, schematics and simulation. The result of the gate level simulation 225 is the development of a custom circuit layout 230. At this point, checks can be performed by the chip designer, and may include both design rule checks as well as layout versus schematic checks, which can compare the circuit layout of step 230 with the gate level model at 220.

Upon satisfactory completion of one or a combination of the design rule checks and an LVS verification, further verification in the form of parasitic extraction 235 may be performed for timing closure. It will be appreciated by those skilled in the art that passing each of these verification steps may require several iterations to refine the preliminary design until it satisfies the requirements of the design rules or other verification parameters.

Following the parasitic extraction step 235, a transistor-level circuit simulation may be performed, for example using HSPICE or some other similar circuit simulation tool. When the results of the transistor level simulation are complete, the process continues at step 240, in which layout, routing and completion of the IC design are performed. An example of this process is illustrated in FIG. 3. It is noted that, although not illustrated in FIG. 2, real-time design rule checks can be performed during the schematic design 220 process and during custom circuit layout 230. In addition, post-design design rule checks can be performed.

The RTL design flow 210 C is now be described in more detail. The RTL design describes the digital circuit as a hierarchy of logic modules that transmit data signals to one another. The transmission can be by way of registers or other clocked devices that store information between clock cycles. The RTL design typically uses high-level expressions to describe the logical relationships between the input and output signals of each logic block.

Based on the requirements of the RTL block, a behavioral model of the design may be developed 222. It will be appreciated by those skilled in the art that the behavioral model may use, for example, VHDL or Verilog. The behavior model design 222 may be followed by a behavioral simulation 227. It will be understood by those skilled in the art that numerous tools are available to the modem chip designer to assist in the development of the behavioral model and simulation.

The designer uses a computer-aided synthesis tool at step 232 to convert the RTL design into a gate-level design. The gate-level design describes the integrated circuit as a set of interconnected instances of components ("cells") such as transistors, logic gates, memories and the like that carry out the logic described by the RTL design. A cell library, typically provided by IC fabricator, can be used to describe the structure and behavior of each cell. At this point, the results of the synthesis 232 can be provided for processing at step 240, in which layout, routing and completion of the IC design are performed. An example of this process is illustrated in FIG. 3.

Turning now to FIG. 3, the place-and-route step 250 makes the interconnects between the circuit modules as specified by the net list. During placement, the layout designers place the circuit blocks at specific locations on the integrated circuit based on the floor-planning map created in step 205. The circuit placement operation may be performed with the help of an electronic design automation (EDA) placement tool to assist in determining optimized placement of the circuit blocks. As described above with reference to FIG. 1, real-time design rule checks 250A can be performed at the layout and routing stage 250 to verify and correct the design as it is being laid out and routed.

After circuit placement, routing is performed. Routing defines the interconnects use to link together the various circuits with interconnect wiring. The routing operation generally encompasses global routing and detailed routing. Global routing partitions the integrated circuit into global routing areas and creates a global routing path for each net. This can be accomplished by listing the global routing areas through which the net must pass. After global routing, the global routing areas are processed using detailed routing to create individual routing paths for each net within the respective global routing area.

Following the place and route step 250, a timing closure/simulation step 255 might be performed. During this process, the product manufacturers (as contrasted to the design team) can perform a series of validations, verifications and/or other checks that might include both design rule checks and LVS verification 265.

Once those steps have been completed, tape-out is performed 270. The completion of tape-out 270 can lead to the generation of a mask set, which may be used to fabricate the physical semiconductor chip(s). Thus, tape-out 270 effectively represents the last step in the design and verification of a particular mask set, and therefore a particular version of a semiconductor. Further, most modern designs utilize resolution enhancement technologies (RET) 280 following physical verification(s) to compensate for limitations in the lithographic processes used to manufacture the chips. RET can include, for example, Off Axis Illumination ("OAI"), Optical Proximity Correction ("OPC"), and Phase-Shifting Masks ("PSM"). The RET step 270 can be used to ensure that the lithographically printed shapes are as close as possible to the originally targeted, designed layout shapes, which can improve the printability of the layout on the silicon wafer. Following RET 280, the mask set for the IC may be generated.

According to embodiments of the present invention, design checks can be made in real time as the IC designer is developing the IC design. Such checks can be made in addition to or in place of the conventional design rule checks that are typically performed on the completed design. These checks can, in various embodiments, identify design issues and flag the error for correction by the designer and even suggest or automatically implement fixes to the design error. In some embodiments, checks are made on the fly to alert the designer to errors or possible design challenges in real time as the design is being made. Such real time checks can be made as the designer is entering the design into the system. In some embodiments, the checks are performed on a design element as the element is being drawn. For example, the checks can be made as a wire is being drawn, as a pattern is being entered and so on. The checks can identify where a violation is about to occur or has occurred as the element is being entered and the user alerted to provide an opportunity to avoid the design rule violation. In other embodiments, the checks are performed upon entry of a design element or shortly there after such that the entered element can be checked upon entry and violations highlighted, if any. Accordingly, real time checks can be performed instantaneously (or seemingly instantaneously) as a design element is in the process of being entered or after its entry has been completed, or shortly thereafter.

In some embodiments, these checks are made based on design rules that are stored in a data base or other data store accessible by the design tool. The design rules can include conventional design rules such as for example, rules to check parameters such as minimum transistor channel length; minimum metal width; active-to-active spacing; well-to-well spacing; metal-to-metal spacing; metal fill density; and so on. Design rules can also include ESD and I/O rules. In various embodiments, design rules can further include images or patterns. For example, the design rules can include known bad patterns that should be avoided for IC designs.

Figure 4:
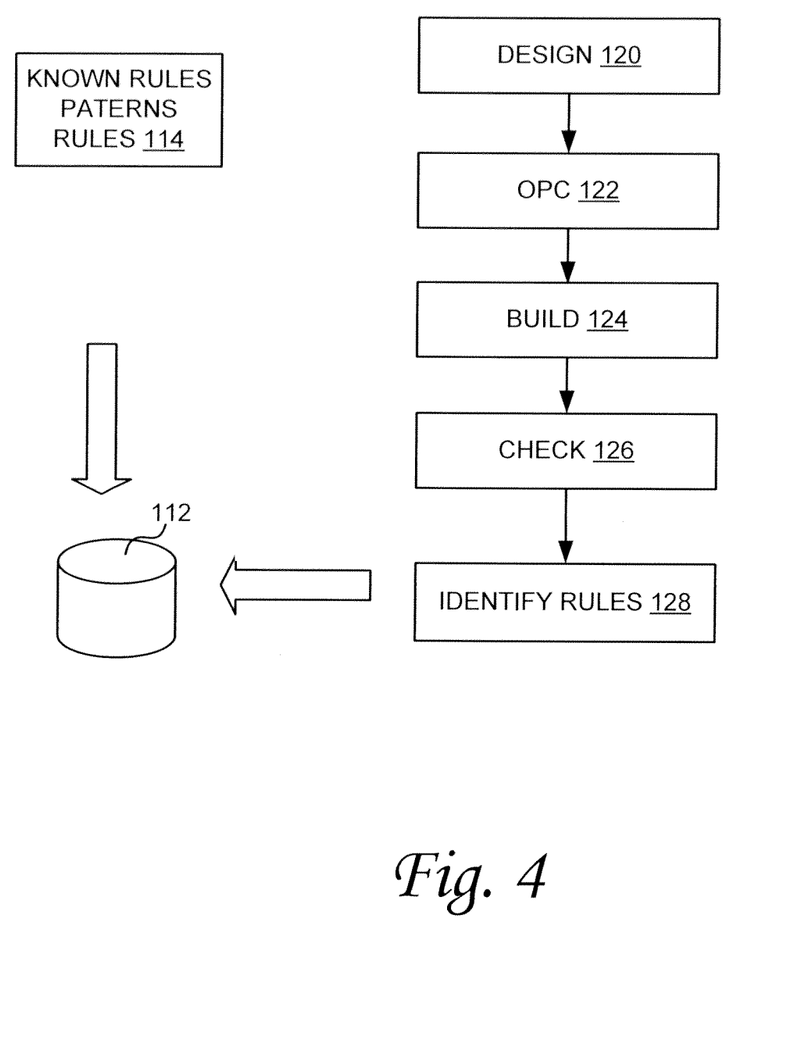
FIG. 4 is a diagram illustrating an example of the creation of a design rules database in accordance with embodiments of the systems and methods described herein.

FIG. 4 is a diagram illustrating an example of the creation of a design rules database in accordance with embodiments of the systems and methods described herein. Referring now to FIG. 4, a rules database 112 is populated. The rules database can be populated using, for example, known design rules 114 to be followed for one or more semiconductor process technologies. As noted above, rules can include conventional design rules such as rules or guidelines for line widths, feature spacings, feature size, and the like. As also noted above, the rules can include images or patterns to be used as well as patterns to be avoided. An example of patterns and the creation of patterns that can be used for design rule checks is provided in U.S. Pat. No. 7,653,892, to Gennari, et al, which is incorporated by reference herein in its entirety. As would be apparent to one of ordinary skill in the art after reading this description, other design rules and other methodologies for design rule creation can also be used in the process.

Design rules can also be created in advance or on the fly, such as, for example, as part of the design process. An example of this is also illustrated in FIG. 4. In this example, at step 120, the design process for an integrated circuit is performed. The resultant circuit can be optimized, such as, for example, using techniques such as OPC and the like as illustrated in step 122. The circuit may then be fabricated and tested as illustrated in steps 124, 126. As a result of the fabrication and testing, design problems or flaws can be identified and collected. Identification of these issues may lead to the creation of rules as illustrated by step 128. For example, known bad patterns can be identified and collected. Accordingly, the design rules referred to herein may include conventional design rules (such as, for example, Boolean design rules), and they may also include images. These patterns may be stored in design rule database 112 for use during real time design checking.

The identification of rules in step 128 may include identifying known bad patterns (in some embodiments, all known bad patterns) and collecting them as rules. In some embodiments, the identification of rules in step 128 may also include identifying known good patterns (in some embodiments, all known good patterns) and collecting them as rules. For example, all design topologies that have not been flagged as a violation according to model-based simulation can be stored in the database 112. In one example, a fixed-size exact pattern can be captured around every printable corner in the design and stored in the database. In other examples, a pattern can be captured around every line end, every contact or via landing pad, or every location where a wire changes directions. Techniques can also be applied to group together similar patterns to form an inexact pattern that can match multiple exact pattern topologies. Examples of some of these techniques are provided in U.S Patent Application No. 2010/0083208 A1, by Lai, et al., which is incorporated herein by reference in its entirety.

Figure 5:
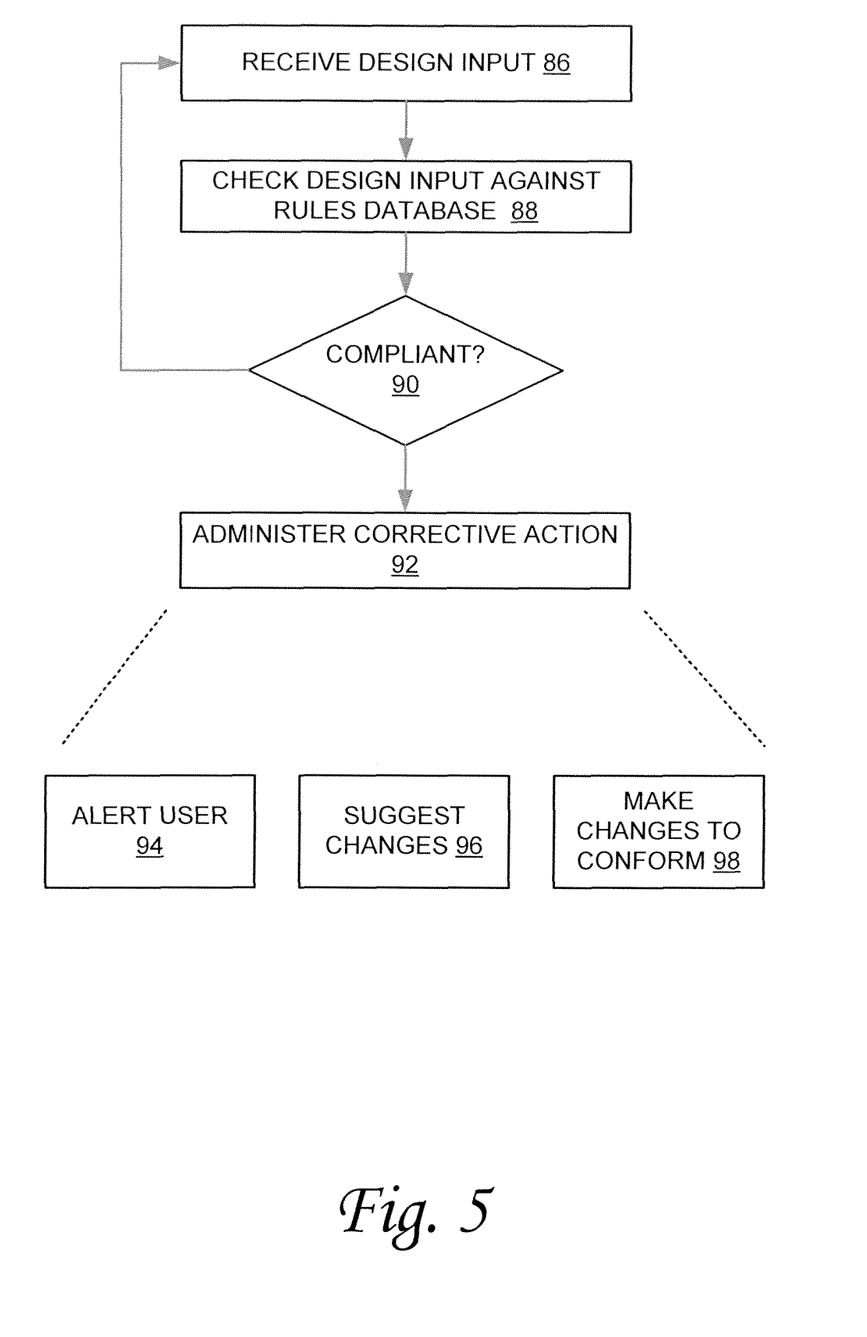
FIG. 5 is a diagram illustrating an example process for applying real time design rule checks in accordance with one embodiment of the systems and methods described herein.

FIG. 5 is a diagram illustrating an example process for applying real time design rule checks in accordance with one embodiment of the systems and methods described herein. Referring now to FIG. 5, in a step 86 the system receives IC design input. For example, during custom IC design (such as at that described at operation 210B, for example), an IC design engineer enters an IC design into the design tool. As another example, during layout and routing (such as that described at operation 215), an IC design engineer performs block placement and inter block routing. During these and other design operations, the design tool receives design input. As these examples illustrate, this design input can include patterns that are to be created on the layers of the semiconductor device to form the components and blocks of the integrated circuit. The design input can also include interconnections between components and blocks.

At step 88, the design tool checks the input against the design rule database 112. For example, patterns in a design can be checked against known patterns in the database, and they can be checked against Boolean and other like design rules. At operation 90, the design tool determines whether the design is compliant based on the design rules. For example, at the image level, a pattern entered in a design can be checked against patterns known to violate design rules (i.e., known violations) to determine whether the entered pattern violates a design rule. At the Boolean level, pattern parameters (such as line width, line spacing, etc.) can be checked against the design rules for the given process technology to determine whether there any violations have occurred.

If a non-compliant design element is detected, corrective action can be administered at operation 92. Examples of corrective action can include alerting the user of the violation 94, suggesting changes in the design to the user to bring the design into compliance with the design rules 96, or making changes to the design to bring the design into compliance with the design rules 98.

Figure 6:
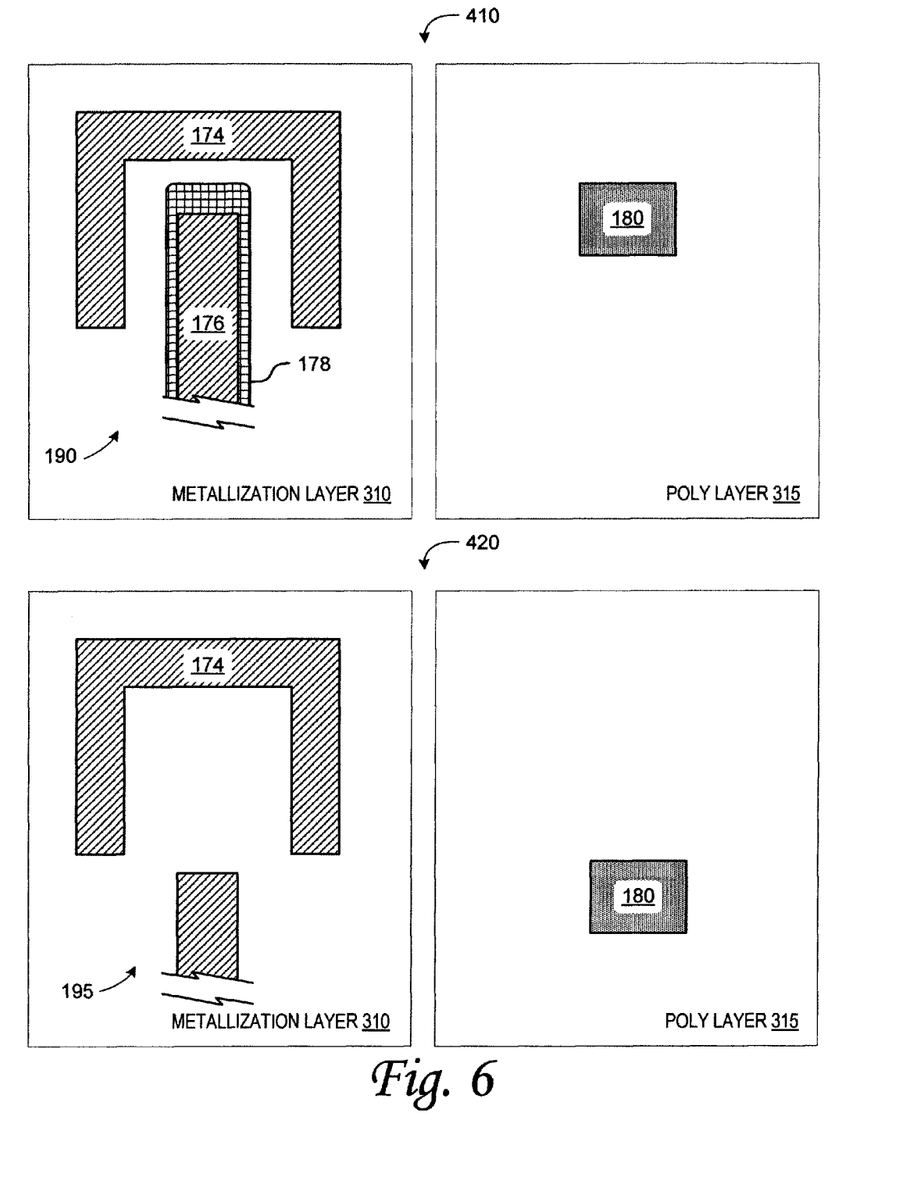
FIG. 6 is a diagram illustrating an example of a design violation and a corrected design for a simple pattern of an IC design.

As described above, in some embodiments patterns of a design are checked against patterns in the database (e.g., database 112) to determine whether a known bad pattern has been entered. Accordingly, pattern matching can be use to perform litho checks on the design. An example of this is illustrated in FIG. 6 which shows a design violation 410 and the corrected design 420 for a simple pattern of an IC design. Referring now to FIG. 6, the violation is a metallization-layer pattern comprising U-shaped pattern 174 with line 176 going up the central portion of "U" 174. Because of the inexactness in the lithography operation, there is inexactness in the placement of line 176. This is illustrated by crosshatched region 178. For simplicity of illustration, inexactness in pattern 174 is not illustrated. Because of the inexactness, this pattern, comprising a U-shaped trace with a line going into the center, is a known violation pattern and in this example was entered into database 112 as such.

Assume in this example that the "U" pattern 174 already existed in the design on metallization layer 310. Further assume in this example that the designer during the design process draws line 176 on metallization layer 310 with the intention of connecting line 176 to a pin 180 at poly layer 315. Upon entry of line 176 into the tool, the tool recognizes the violation and administers corrective action (operations 88, 90 and 92 of FIG. 5). For example, in various embodiments the corrective action can include highlighting the known bad pattern on the user interface, informing the designer of the violation using a textual or other message on the user interface, or otherwise informing the designer of the violation. The corrective action may also include preventing the user from drawing line 176 in violation of the design rules. As yet another example, the corrective action can include the design tool moving the connection to the poly layer and redrawing the wire to fulfill the designer's intent while avoiding the design rule violation. An example of the correction is shown at 420 in which line 176 is shortened so as to not cross into "U" 174, and pin 180 at poly layer 315 is moved accordingly. After this corrective action, the violation has been removed and the original design intent has been met.

In some embodiments, such corrective action can be made automatically, or it can be suggested to the user and the user given the opportunity to approve the change or to make a different change to bring the design element into compliance with the design rules.

In some embodiments the pattern database 112 contains patterns that should be used instead of or in addition to, patterns that should be avoided. These are referred to as a good pattern flow. For example, referring to FIG. 6, the pattern database 112 might contain the valid pattern shown in 420 but would not contain invalid patterns such as a pattern shown in 410. As the user is creating the design, pattern matching can be used to perform real time checks against this database of valid patterns. If the user attempts to create something that is not in the database 112, for example trying to create the pattern 410, the tool can report a violation as part of the process of checking the design input against the rules database (operation 88).

In some embodiments of the good pattern flow, when a violation is reported, the tool can use pattern matching to find one or multiple valid patterns that are similar to the violation. These valid patterns can form the basis of the corrective action (operation 92).

The real time design rule checks are not limited to pattern matching. For example, the system can be implemented to perform other checks, including Boolean checks such as those described above. Likewise, the system can be implemented to check wire routing, driver size and other system or element parameter specifications during design. Where parameter specifications have been exceeded, the system can be configured to detect this condition and to resize or update the specified component or element to ensure properly specified design elements. To illustrate, consider another example. In this example, a designer is connecting a buffer to another gate. As the designer drags his or her mouse to lay down the wire, the tool can be configured to check the length of the wire and evaluate the design in light of the drive current of the buffer/driver. In a situation where the wire length exceeds the driving capacity of the buffer, the real-time design rule checks may detect this condition and administer corrective action. The corrective action could be, for example, to resize the buffer/driver automatically to provide more drive current. For example, the corrective action could be to switch or to recommend switching from a 2× inverter to a 4× inverter. As another example, the corrective action that could be recommended or performed would be to re-route the wire along a shorter route or to move the connected design elements closer together to result in a shorter route. After moving circuit elements or blocks and rerouting, the system can check the changed design features to ensure that no other design rule violations have been introduced. Accordingly, in this scenario, examples of design rules can include maximum line length for a given driver.

As another example of checking element parameter specifications during design, the system can be configured to check for RC loading as a wire is drawn. The digital propagation delay of a resistive wire is proportional to the wire's resistance, R, and capacitance, C, which are both proportional to wire length. This delay scales as the square of wire length.

Accordingly, in addition to driver considerations, timing considerations can also be taken into account and addressed in real time as the circuit is being designed. Where the RC loading reaches a point that performance is compromised according to the design rules, the system can take or recommend corrective action. Such corrective action can include, for example, rerouting the wire along a shorter route (which may necessitate rerouting other interfering wires) or moving the connected elements closer together to shorten the wire length.

In another embodiment, the system can be configured to check for alternative routing as the wire is being drawn, and to reroute the wire, or suggest rerouting the wire, along a better route. A better route may be chosen, for example, based on length of the route, interference by other components, number of crossings of other nets, parasitics and other metrics.

In further embodiments, as routing is being performed, the system can perform DFM analysis and implement DFM modifications to the design to reduce yield losses as may be appropriate. For example, the system can be implemented to recommend (or to change to) wire spreading, double via cuts, contact or via bars, and route cleanup. Additionally, the system may be configured to check for stress effects and suggest changes such as moving elements apart and adding dummy patterns to achieve a more uniform effective pattern density across the wafer.

In some embodiments, the system can add design elements to the IC design. For example, consider the case where the designer is placing a critical wire in the design such as a clock wire or critical path net. The system can be configured to automatically add (or to recommend adding) shielding for the wire as it is being drawn and to connect the shielding to ground.

Embodiments of the invention can also be configured to allow the user to identify critical features as a way of influencing the real-time correction process. For example, when drawing a wire, the user may be given the option of identifying the wire as a critical wire or a high priority wire. Critical features, or features with a higher relative priority than other features may, in some embodiments, be given preferential treatment for design rule checks and changes. Consider an example where a user is drawing a critical wire to interconnect two circuit elements.

In various embodiments, the user is provided with real-time feedback as to the design and corrections or suggested corrections to the design. For example, in some embodiments design errors as a result of the real-time design checks can be highlighted to the user on the user interface display. In some embodiments, a design error (e.g., a non-compliance based on a design rule) can be highlighted to flag to the user that an error needs to be corrected. In further embodiments, the design error and the suggested or implemented correction can be highlighted to illustrate to the user both the error and the correction. In some embodiments, the error and correction can be highlighted in a contrasting fashion to better differentiate the two. Highlighting can be accomplished, for example, by using different colors on the display, by flashing images, by outlining, or by other techniques to highlight, illustrate or otherwise call the users attention to the area of interest. Pre and post correction elements can be highlighted simultaneously, in an alternating fashion, on separate windows or split screens, using pop-ups or other techniques. Highlighting elements in both pre and post correction configurations, can allow the user to see and evaluate the differences.

Consider the example illustrated in FIG. 6 in which a known bad pattern 190 is identified and a corrected pattern 195 is implemented or suggested. In various embodiments, the patterns 190, 195 can be displayed and highlighted to call the user's attention to the non-compliant element and the correction. For example, the display can toggle between pattern 190 and 195 to allow the user to see the difference. As another example, corrected pattern 195 can be displayed on a pop-up window to present the corrected pattern 195 to the user for review, modification or approval.

In some embodiments, the user is given the ability to accept the change as recommended, or to accept the change as already made. In some embodiments, the user is given the opportunity to modify the correction suggested or implemented by the system or to manually implement some alternative correction action.

In some embodiments, the checks are made as a design element is implemented. For example, when a wire is drawn or a pattern is made, the system performs a check on that component. In some embodiments, the checks are made as the feature is being drawn so that the tool can alert the user to the fact that he is about to draw a had pattern or implement a non-compliant element. Accordingly, the user can decide on the fly to accept the corrections, or to draw design differently to avoid the non-compliant configuration before the element is laid down in the design. Performing the various checks such as those described above (pattern matching, DRCs, connectivity checks, etc) and alerting the user in real time (as the element is drawn, or even as it is being drawn) allows the design to be corrected before finalization (and before post-design non-real-time DRCs).

The term tool can be used to refer to any apparatus configured to perform a recited function. For example, tools can include a collection of one or more modules and can also be comprised of hardware, software or a combination thereof. Thus, for example, a tool can be a collection of one or more software modules, hardware modules, software/hardware modules or any combination or permutation thereof. As another example, a tool can be a computing device or other appliance on which software runs or in which hardware is implemented.

Figure 7:
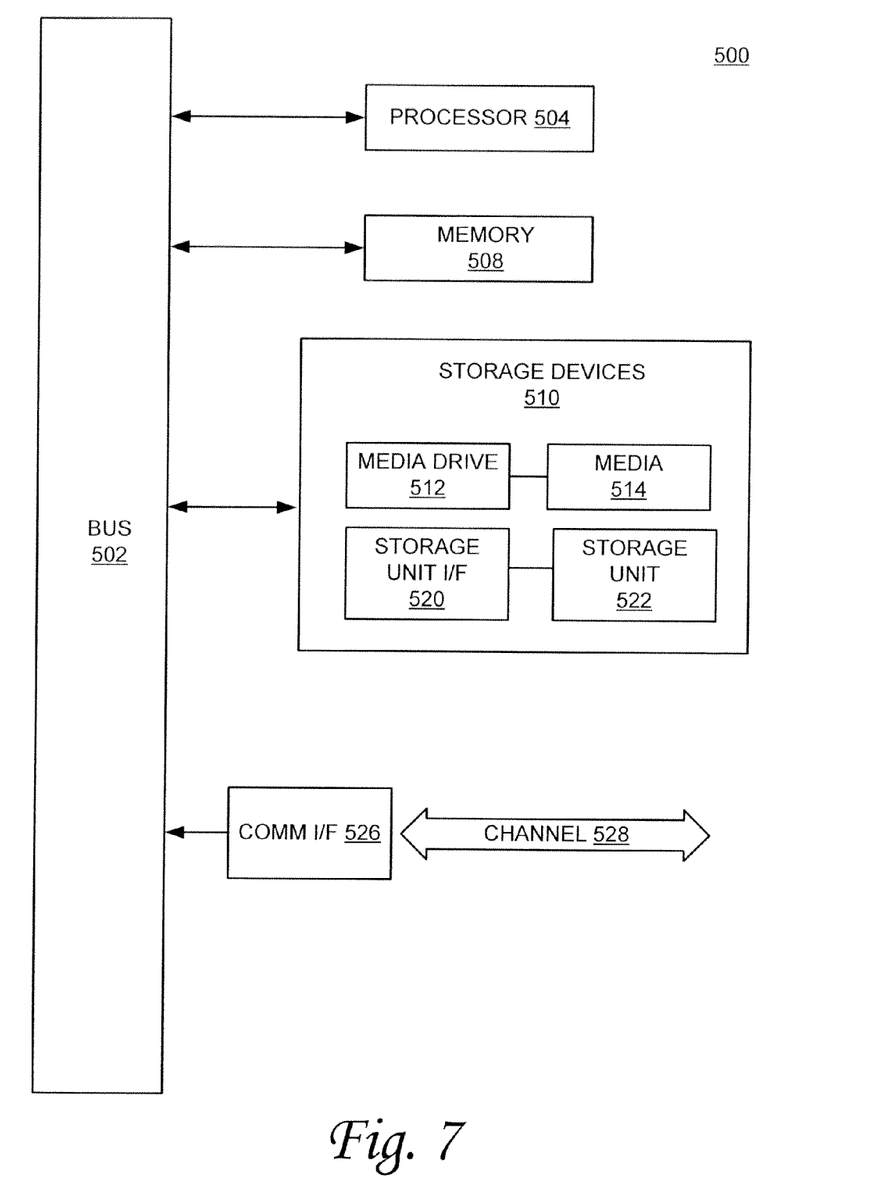
FIG. 7 is a diagram illustrating an example computing module that may be used in implementing various features of embodiments of the disclosed systems and methods.

As used herein, the term module might describe a given unit of functionality that can be performed in accordance with one or more embodiments of the present invention. As used herein, a module might be implemented utilizing any form of hardware, software, or a combination thereof. For example, one or more processors, controllers, ASICs, PLAs, logical components, software routines or other mechanisms might be implemented to make up a module. In implementation, the various modules described herein might be implemented as discrete modules or the functions and features described can be shared in part or in total among one or more modules. In other words, as would be apparent to one of ordinary skill in the art after reading this description, the various features and functionality described herein may be implemented in any given application and can be implemented in one or more separate or shared modules in various combinations and permutations. Even though various features or elements of functionality may be individually described or claimed as separate modules, one of ordinary skill in the art will understand that these features and functionality can be shared among one or more common software and hardware elements, and such description shall not require or imply that separate hardware or software components are used to implement such features or functionality.

Where components or modules of processes used in conjunction with the operations described herein are implemented in whole or in part using software, in one embodiment, these software elements can be implemented to operate with a computing or processing module capable of carrying out the functionality described with respect thereto. One such example-computing module is shown in FIG. 7. Various embodiments are described in terms of this example-computing module 500. After reading this description, it will become apparent to a person skilled in the relevant art how to implement the invention using other computing modules or architectures.

Referring now to FIG. 7, computing module 500 may represent, for example, computing or processing capabilities found within desktop, laptop and notebook computers; handheld computing devices (PDA's, smart phones, cell phones, palmtops, etc.); mainframes, supercomputers, workstations or servers; or any other type of special-purpose or general-purpose computing devices as may be desirable or appropriate for a given application or environment. Computing module 500 might also represent computing capabilities embedded within or otherwise available to a given device. For example, a computing module 500 might be found in electronic devices such as, for example, digital cameras, navigation systems, cellular telephones, portable computing devices, modems, routers, wireless access points (WAPs), terminals and other electronic devices that might include some form of processing capability.

Computing module 500 might include, for example, one or more processors, controllers, control modules, or other processing devices, such as a processor 504. Processor 504 might be implemented using a general-purpose or special-purpose processing engine such as, for example, a microprocessor, controller, or other control logic. In the illustrated example, processor 504 is connected to a bus 502, although any communication medium can be used to facilitate interaction with other components of computing module 500 or to communicate externally.

Computing module 500 might also include one or more memory modules, simply referred to herein as main memory 508. For example, preferably random access memory (RAM) or other dynamic memory, might be used for storing information and instructions to be executed by processor 504. Main memory 508 might also be used for storing temporary variables or other intermediate information during execution of instructions to be executed by processor 504. Computing module 500 might likewise include a read only memory ("ROM") or other static storage device coupled to bus 502 for storing static information and instructions for processor 504.

The computing module 500 might also include one or more various forms of information storage mechanism 510, which might include, for example, a media drive 512 and a storage unit interface 520. The media drive 512 might include a drive or other mechanism to support fixed or removable storage media 514. For example, a hard disk drive, a floppy disk drive, a magnetic tape drive, an optical disk drive, a CD or DVD drive (R or RW), or other removable or fixed media drive might be provided. Accordingly, storage media 514 might include, for example, a hard disk, a floppy disk, magnetic tape, cartridge, optical disk, a CD or DVD, or other fixed or removable medium that is read by, written to or accessed by media drive 512. As these examples illustrate, the storage media 514 can include a computer usable storage medium having stored therein computer software or data.

In alternative embodiments, information storage mechanism 510 might include other similar instrumentalities for allowing computer programs or other instructions or data to be loaded into computing module 500. Such instrumentalities might include, for example, a fixed or removable storage unit 522 and an interface 520. Examples of such storage units 522 and interfaces 520 can include a program cartridge and cartridge interface, a removable memory (for example, a flash memory or other removable memory module) and memory slot, a PCMCIA slot and card, and other fixed or removable storage units 522 and interfaces 520 that allow software and data to be transferred from the storage unit 522 to computing module 500.

Computing module 500 might also include a communications interface 524. Communications interface 524 might be used to allow software and data to be transferred between computing module 500 and external devices. Examples of communications interface 524 might include a modem or softmodem, a network interface (such as an Ethernet, network interface card, WiMedia, IEEE 802.XX or other interface), a communications port (such as for example, a USB port, IR port, RS232 port Bluetooth® interface, or other port), or other communications interface. Software and data transferred via communications interface 524 might typically be carried on signals, which can be electronic, electromagnetic (which includes optical) or other signals capable of being exchanged by a given communications interface 524. These signals might be provided to communications interface 524 via a channel 528. This channel 528 might carry signals and might be implemented using a wired or wireless communication medium. Some examples of a channel might include a MoCA channel over coaxial cable, phone line, a cellular link, an RF link, an optical link, a network interface, a local or wide area network, and other wired or wireless communications channels.

In this document, the terms "computer program medium" and "computer usable medium" are used to generally refer to physical storage media such as, for example, memory 508, storage unit 520, and media 514. These and other various forms of computer program storage media or computer usable storage media may be involved in storing and providing one or more sequences of one or more instructions to a processing device for execution. Such instructions embodied on the medium, are generally referred to as "computer program code" or a "computer program product" (which may be grouped in the form of computer programs or other groupings). When executed, such instructions might enable the computing module 500 to perform features or functions of the disclosed systems and methods as discussed herein.

While various embodiments of the disclosed systems and methods have been described above, it should be understood that they have been presented by way of example only, and not of limitation. Likewise, the various diagrams may depict an example architectural or other configuration for the disclosed systems and methods, which is done to aid in understanding the features and functionality that can be included in the disclosed systems and methods. The claimed invention is not restricted to the illustrated example architectures or configurations, but the desired features can implemented using a variety of alternative architectures and configurations. Indeed, it will be apparent to one of skill in the art how alternative functional, logical or physical partitioning and configurations can be implemented to implement the desired features of the disclosed systems and methods. Also, a multitude of different constituent module names other than those depicted herein can be applied to the various partitions. Additionally, with regard to flow diagrams, operational descriptions and method claims, the order in which the blocks are presented herein shall not mandate that various embodiments be implemented to perform the recited functionality in the same order unless the context dictates otherwise.

Although the disclosed systems and methods is described above in terms of various exemplary embodiments and implementations, it should be understood that the various features, aspects and functionality described in one or more of the individual embodiments are not limited in their applicability to the particular embodiment with which they are described, but instead can be applied, alone or in various combinations, to one or more of the other embodiments of the disclosed systems and methods, whether or not such embodiments are described and whether or not such features are presented as being a part of a described embodiment. Thus, the breadth and scope of the claimed invention should not be limited by any of the above-described embodiments which are presented as mere examples for illustration only.

Terms and phrases used in this document, and variations thereof, unless otherwise expressly stated, should be construed as open ended as opposed to limiting. As examples of the foregoing: the term "including" should be read as meaning "including, without limitation" or the like; the term "example" is used to provide exemplary instances of the item in discussion, not an exhaustive or limiting list thereof; the terms "a" or "an" should be read as meaning "at least one," "one or more" or the like; and adjectives such as "conventional," "traditional," "normal," "standard," "known" and terms of similar meaning should not be construed as limiting the item described to a given time period or to an item available as of a given time, but instead should be read to encompass conventional, traditional, normal, or standard technologies that may be available or known now or at any time in the future. Likewise, where this document refers to technologies that would be apparent or known to one of ordinary skill in the art, such technologies encompass those apparent or known to the skilled artisan now or at any time in the future.

The presence of broadening words and phrases such as "one or more," "at least," "but not limited to" or other like phrases in some instances shall not be read to mean that the narrower case is intended or required in instances where such broadening phrases may be absent. The use of the term "module" does not imply that the components or functionality described or claimed as part of the module are all configured in a common package. Indeed, any or all of the various components of a module, whether control logic or other components, can be combined in a single package or separately maintained and can further be distributed in multiple groupings or packages or across multiple locations.

Additionally, the various embodiments set forth herein are described in terms of exemplary block diagrams, flow charts and other illustrations. As will become apparent to one of ordinary skill in the art after reading this document, the illustrated embodiments and their various alternatives can be implemented without confinement to the illustrated examples. For example, block diagrams and their accompanying description should not be construed as mandating a particular architecture or configuration.

The invention claimed is:

1. A method for real-time design checking for an integrated circuit design, comprising:
   receiving at a design tool implemented with a processor, design elements of an integrated circuit design entered by an integrated circuit designer;
   the design tool performing real-time design checks on the design elements as they are entered by the integrated circuit designer to determine whether a design element violates a design rule;
   when the design tool detects a violation of a design rule based on the design checks alerting the integrated circuit designer; and
   upon detection of a violation, the design tool automatically presenting a design element compliant with the violated design rule to the integrated circuit designer to correct the violation of the design rule.

2. The method of claim 1, wherein the real-time design checks comprise, for a plurality of design elements, comparing each design element to one or more known non-compliant design elements stored in a design rule database to determine whether a non-compliant design element was entered by the integrated circuit designer.

3. The method of claim 1, wherein the real-time design checks comprise, for a plurality of design elements, comparing each design element to one or more known compliant design elements stored in a design rule database to determine whether a compliant design element is being entered by the integrated circuit designer.

4. The method of claim 1, wherein the operation of presenting a correction to correct the violation of the design rule comprises the design tool automatically substituting a corrected design element for a non-compliant design element that resulted in the violation of the design rule.

5. The method of claim 1, wherein the operation of presenting a correction to correct the violation of the design rule comprises the design tool presenting a valid design element to the integrated circuit designer and providing the integrated circuit designer with an option to substitute the valid design element in place of a non-compliant design element that resulted in the violation of the design rule.

6. The method of claim 5, further comprising the design tool receiving a user selection regarding substituting the valid design element in place of a non-compliant design element and, if instructed by the user make the substitution, replacing the non-compliant design element with the valid design element in the circuit.

7. The method of claim 1, wherein the design elements comprise patterns on one or more layers of the integrated circuit and the real-time design checks comprise comparing the patterns with known patterns in a database using image based pattern recognition as the design elements are entered into the integrated circuit design.

8. The method of claim 7, wherein the method further comprises identifying known good patterns in one or more circuit designs and storing the known good patterns in the database.

9. The method of claim 1, wherein the design elements comprise wire interconnects between integrated circuit components, and a real-time design check for a given wire comprises a checking circuit parameter associated with the wire against one or more defined circuit parameters in a database to determine whether the wire as drawn, or as it is being drawn, constitutes a design violation.

10. The method of claim 9, wherein the circuit parameter comprises at least one of wire length, driver specification, wire RC characteristics, load amount, and parasitic effects.

11. The method of claim 10, wherein the correction comprises at least one of respecifying a driver driving the given wire, adding shielding along a portion or along the length of the wire, rerouting the wire along a shorter route, altering the layout of the design to relocate the integrated circuit components being connected by the wire.

12. The method of claim 11, further comprising adding connections to ground for the shielding.

13. The method of claim 11, wherein the correction is implemented automatically by the design tool, or the correction is presented to the integrated circuit designer and the design tool accepts input from the integrated circuit designer instructing the design tool whether or not to implement all or part of the correction.

14. The method of claim 1, wherein the a real-time design check for a first design element comprises performing DFM analysis on the first design element, and wherein the correction comprises at least one of wire spreading, using double cut vias, using contact of via bars, substituting higher yield cells where permitted by timing, power, and routability, changing the spacing and width of interconnect wires, and adding dummy patterns.

15. The method of claim 1, further comprising the design tool receiving input from the integrated circuit designer identifying a design element as a critical feature, and wherein the design tool selects the correction based on whether or not the design element is a critical feature.

16. The method of claim 1, wherein alerting the integrated circuit designer comprises highlighting a design element that is identified as violating a design rule or providing a message to the designer that the design element violates a design rule.

17. The method of claim 16, wherein presenting a correction to correct the violation of the design rule comprises displaying a known valid design element to the integrated circuit designer that can be used in place of or in addition to the design element that is identified as violating a design rule.

18. The method of claim 17, wherein the correction is implemented automatically by the design tool, or the correction is presented to the integrated circuit designer and the design tool accepts input from the integrated circuit designer instructing the design tool whether or not to implement all or part of the correction.

19. An integrated circuit design tool, comprising:
at least one non-transitory storage medium;
one or more processors coupled to the at least one storage medium; and
computer code stored in the at least one storage medium, wherein said computer code, when retrieved from the at least one storage medium and executed by the one or more processors, results in:
receiving at a design tool, design elements of an integrated circuit design entered by an integrated circuit designer;
the design tool performing real-time design checks on the design elements as they are entered by the integrated circuit designer to determine whether a design element violates a design rule;
when the design tool detects a violation of a design rule based on the design checks alerting the integrated circuit designer; and
upon detection of a violation, the design tool automatically presenting a design element compliant with the violated design rule to the integrated circuit designer to correct the violation of the design rule.

20. The integrated circuit design tool of claim 19, wherein the real-time design checks comprise, for a plurality of design elements, comparing each design element to one or more known non-compliant design elements stored in a design rule database to determine whether a non-compliant design element was entered or that is being entered by the integrated circuit designer.

21. The integrated circuit design tool of claim 19, wherein the operation of presenting a correction to correct the violation of the design rule comprises the design tool automatically substituting a corrected design element for a non-compliant design element that resulted in the violation of the design rule.

22. The integrated circuit design tool of claim 19, wherein the operation of presenting a correction to correct the violation of the design rule comprises the design tool presenting a valid design element to the integrated circuit designer and providing the integrated circuit designer with an option to substitute the valid design element in place of a non-compliant design element that resulted in the violation of the design rule.

23. The integrated circuit design tool of claim 22, further comprising the design tool receiving a user selection regarding substituting the valid design element in place of a non-compliant design element and, if instructed by the user make the substitution, replacing the non-compliant design element with the valid design element in the circuit.

24. The integrated circuit design tool of claim 19, wherein the design elements comprise patterns on one or more layers of the integrated circuit and the real-time design checks comprise comparing the patterns with known patterns in a database using image based pattern recognition as the design elements are entered into the integrated circuit design.

25. The integrated circuit design tool of claim 19, wherein the design elements comprise wire interconnects between integrated circuit components, and a real-time design check for a given wire comprises a checking circuit parameter associated with the wire against one or more defined circuit parameters in a database to determine whether the wire as drawn, or as it is being drawn, constitutes a design violation.

26. The integrated circuit design tool of claim 19, wherein alerting the integrated circuit designer comprises highlighting a design element that is identified as violating a design rule or providing a message to the designer that the design element violates a design rule.

27. The integrated circuit design tool of claim 26, wherein presenting a correction to correct the violation of the design rule comprises displaying a known valid design element to the integrated circuit designer that can be used in place of or in addition to the design element that is identified as violating a design rule.

28. The integrated circuit design tool of claim 27, wherein the correction is implemented automatically by the design tool, or the correction is presented to the integrated circuit designer and the design tool accepts input from the integrated circuit designer instructing the design tool whether or not to implement all or part of the correction.

29. A non-transitory computer-usable storage medium comprising executable computer code stored in the computer-usable storage medium, wherein the executable computer code when executed by a computer system that comprises at least one processor, causes the computer system to execute a method for performing real time design checks of an integrated circuit design, the method comprising:
receiving at a design tool, design elements of an integrated circuit design entered by an integrated circuit designer;
the design tool performing real-time design checks on the design elements as they are entered by the integrated circuit designer to determine whether a design element violates a design rule;
when the design tool detects a violation of a design rule based on the design checks alerting the integrated circuit designer; and
upon detection of a violation, the design tool automatically presenting a design element compliant with the violated design rule to the integrated circuit designer to correct the violation of the design rule.

30. The computer-usable storage medium of claim 29, wherein the real-time design checks comprise, for a plurality of design elements, comparing each design element to one or more known non-compliant design elements stored in a design rule database to determine whether a non-compliant design element was entered by the integrated circuit designer.

31. The computer-usable storage medium of claim 29, wherein the real-time design checks comprise, for a plurality of design elements, comparing each design element to one or more known compliant design elements stored in a design rule database to determine whether a compliant design element is being entered by the integrated circuit designer.

32. The computer-usable storage medium of claim 29, wherein the operation of presenting a correction to correct the violation of the design rule comprises the design tool automatically substituting a corrected design element for a non-compliant design element that resulted in the violation of the design rule.

33. The computer-usable storage medium of claim 29, wherein the operation of presenting a correction to correct the violation of the design rule comprises the design tool presenting a valid design element to the integrated circuit designer and providing the integrated circuit designer with an option to substitute the valid design element in place of a non-compliant design element that resulted in the violation of the design rule.

34. The computer-usable storage medium of claim 29, further comprising the design tool receiving a user selection regarding substituting the valid design element in place of a non-compliant design element and, if instructed by the user make the substitution, replacing the non-compliant design element with the valid design element in the circuit.

35. The computer-usable storage medium of claim 29, wherein the design elements comprise patterns on one or more layers of the integrated circuit and the real-time design checks comprise comparing the patterns with known patterns in a database using image based pattern recognition as the design elements are entered into the integrated circuit design.

36. The computer-usable storage medium of claim 29, wherein the design elements comprise wire interconnects between integrated circuit components, and a real-time design check for a given wire comprises a checking circuit parameter associated with the wire against one or more defined circuit parameters in a database to determine whether the wire as drawn, or as it is being drawn, constitutes a design violation.

37. The computer-usable storage medium of claim 29, wherein alerting the integrated circuit designer comprises highlighting a design element that is identified as violating a design rule or providing a message to the designer that the design element violates a design rule.

38. The computer-usable storage medium of claim 37, wherein presenting a correction to correct the violation of the design rule comprises displaying a known valid design element to the integrated circuit designer that can be used in place of or in addition to the design element that is identified as violating a design rule.

39. The computer-usable storage medium of claim 38, wherein the correction is implemented automatically by the design tool, or the correction is presented to the integrated circuit designer and the design tool accepts input from the integrated circuit designer instructing the design tool whether or not to implement all or part of the correction.

* * * * *